(12) United States Patent
Otremba

(10) Patent No.: US 7,541,681 B2
(45) Date of Patent: Jun. 2, 2009

(54) INTERCONNECTION STRUCTURE, ELECTRONIC COMPONENT AND METHOD OF MANUFACTURING THE SAME

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 11/381,550

(22) Filed: May 4, 2006

(65) Prior Publication Data

US 2007/0259514 A1 Nov. 8, 2007

(51) Int. Cl.
  *H01L 23/48* (2006.01)
  *H01L 23/52* (2006.01)
  *H01L 29/40* (2006.01)

(52) U.S. Cl. .................. 257/781; 257/778; 257/780

(58) Field of Classification Search ............... 257/778, 257/781, 780, 677, 779
  See application file for complete search history.

(56) References Cited

U.S. PATENT DOCUMENTS

| | | | |
|---|---|---|---|
| 5,582,990 A | 12/1996 | Bergstrom et al. | 435/6 |
| 6,133,634 A | 10/2000 | Joshi | 257/738 |
| 6,249,051 B1 * | 6/2001 | Chang et al. | 257/737 |
| 6,344,690 B1 * | 2/2002 | Kitajima et al. | 257/741 |
| 6,459,147 B1 | 10/2002 | Crowley et al. | 257/692 |
| 6,465,875 B2 | 10/2002 | Connah et al. | 257/666 |
| 6,476,481 B2 | 11/2002 | Woodworth et al. | 257/696 |
| 6,582,990 B2 | 6/2003 | Standing | 438/106 |
| 6,624,522 B2 | 9/2003 | Standing et al. | 257/782 |
| 6,646,329 B2 | 11/2003 | Estacio et al. | 257/666 |
| 6,677,669 B2 | 1/2004 | Standing | 257/685 |
| 6,683,375 B2 | 1/2004 | Joshi et al. | 257/690 |
| 6,767,820 B2 | 7/2004 | Standing et al. | 438/614 |
| 6,777,800 B2 | 8/2004 | Madrid et al. | 257/690 |
| 6,861,286 B2 | 3/2005 | Estacio et al. | 438/108 |
| 6,870,254 B1 | 3/2005 | Estacio et al. | 257/692 |
| D503,691 S | 4/2005 | Standing et al. | D13/182 |
| 6,890,845 B2 | 5/2005 | Standing et al. | 438/614 |
| 6,891,256 B2 | 5/2005 | Joshi et al. | 257/676 |
| 6,893,901 B2 | 5/2005 | Madrid | 438/122 |
| 6,930,397 B2 | 8/2005 | Standing et al. | 257/782 |
| 7,064,446 B2 * | 6/2006 | Barnak et al. | 257/779 |
| 7,220,657 B2 * | 5/2007 | Ihara et al. | 438/466 |
| 7,276,801 B2 * | 10/2007 | Dubin et al. | 257/779 |
| 2001/0052641 A1 | 12/2001 | Kuo et al. | 257/686 |
| 2002/0125550 A1 | 9/2002 | Estacio | 257/666 |

(Continued)

FOREIGN PATENT DOCUMENTS

DE 10122191 A1 8/2002

(Continued)

OTHER PUBLICATIONS

Sawle A., et al.; "DirectFET™—A Proprietary New Source Mounted Power Package for Board Mounted Power"; International Rectifier; Oxted, Surrey, England.

(Continued)

*Primary Examiner*—S. V Clark
(74) *Attorney, Agent, or Firm*—Banner & Witcoff, Ltd.

(57) ABSTRACT

An interconnection structure includes an electrically conductive bump, wherein the electrically conductive bump has a metal body having a distal end. The metal body is free of solder. An outermost layer of diffusion solder is positioned on at least regions of the metal body of the electrically conductive bump.

31 Claims, 2 Drawing Sheets

U.S. PATENT DOCUMENTS

| | | | |
|---|---|---|---|
| 2003/0001247 A1 | 1/2003 | Standing | 257/678 |
| 2003/0019080 A1 | 1/2003 | Anthony et al. | 24/68 R |
| 2003/0052408 A1 | 3/2003 | Quinones et al. | 257/737 |
| 2003/0173684 A1 | 9/2003 | Joshi et al. | 257/783 |
| 2004/0026796 A1 | 2/2004 | Standing et al. | 257/782 |
| 2004/0137724 A1 | 7/2004 | Joshi et al. | 438/672 |
| 2005/0121784 A1 | 6/2005 | Standing | 257/737 |
| 2005/0224960 A1 | 10/2005 | Standing et al. | 257/723 |
| 2006/0017174 A1 | 1/2006 | Otremba | 257/778 |

FOREIGN PATENT DOCUMENTS

| | | |
|---|---|---|
| DE | 10249206 B3 | 7/2004 |
| DE | 102004030042 A1 | 1/2006 |
| WO | WO 2004/038797 A1 | 5/2004 |

OTHER PUBLICATIONS

Sawle A., et al.; "Novel Power MOSFET Packaging Technology Doubles Power Density in Synchronous Buck Converters for Next Generation Microprocessors"; International Rectifier; Oxted, Surrey, England.

Warren Welch, III, et al., "Transient Liquid Phase (TLP) Bonding For Microsystem Packaging Applications", 13th International Conference on Solid State Sensors, Actuators and Microsystems, Seoul, Korea, Jun. 5-9, 2005, pp. 1350-1353.

* cited by examiner

INTERCONNECTION STRUCTURE, ELECTRONIC COMPONENT AND METHOD OF MANUFACTURING THE SAME

TECHNICAL FIELD

The application relates to an interconnection structure, an electronic component comprising the interconnection structure and to methods of producing the interconnection structure and electronic component.

BACKGROUND

Electronic components including a semiconductor chip are normally provided in the form of a package which includes a housing to protect the semiconductor chip and outer contact areas such as pins or solder balls which enable the semiconductor chip to be electrically accessed from outside of the package housing.

After an electronic component is manufactured, the electronic component is normally mounted on a higher level circuit board such as a printed circuit board (PCB) by solder connections between the external contact areas of the component and the higher-level circuit board. This may be carried out by a solder reflow process during which the solder is melted and allowed to resolidify to produce a mechanical and electrical connection between the electronic component and the PCB. This mounting process is normally carried out by the customer.

However, the electronic component may be damaged during the mounting process so that an electronic component which correctly functioned after manufacture no longer functions when mounted on the PCB. This is undesirable as the electronic component has to be replaced.

SUMMARY

In one embodiment, an interconnection structure comprises an electrically conductive bump. The electrically conductive bump comprises a metal body having a distal end. The metal body is free of solder and an outermost layer of diffusion solder is positioned on at least regions of the metal body.

In one embodiment, a semiconductor die comprises a surface and a plurality of electrically conductive bumps. Each of the plurality of electrically conductive bumps comprises a metal body having a distal end. The metal body is free of solder and an outermost layer of diffusion solder is positioned on at least regions of the metal body.

In one embodiment, a configuration comprises at least one semiconductor die having a first device surface. A plurality of electrically conductive bumps is positioned on the first device surface, each of the plurality of electrically conductive bumps comprising a metal body which is free of solder and has a distal end. The configuration further comprises a substrate comprising a first substrate surface. The substrate comprises electrically conductive surfaces positioned on the first substrate surface. The plurality of electrically conductive bumps are attached to the electrically conductive surfaces of the substrate by a diffusion solder bond positioned between the metal body of the electrically conductive bumps and the electrically conductive surfaces of the substrate.

In one embodiment, a method comprises providing a surface comprising a plurality electrically conductive bumps. The plurality of bumps each comprise a metal body having a distal end, the metal body being free of solder. A layer of diffusion solder is deposited onto at least regions of the metal body.

In one embodiment, a method comprises providing a substrate having a first substrate surface and a plurality of electrically conductive surfaces positioned on the first substrate surface. A semiconductor die having a die surface is provided. A plurality of electrically conductive bumps is positioned on the die surface, each electrically conductive bump comprising a solder free metal body having a distal end and an outermost layer of diffusion solder positioned on at least the distal end of the metal bodies. The semiconductor die and the substrate are arranged so that the layer of diffusion solder is in surface to surface contact with the electrically conductive surfaces of the substrate. A diffusion solder process is carried out to attach and electrically connect the plurality of electrically conductive bumps to the electrically conductive surfaces of the substrate.

DETAILED DESCRIPTION

Figure 1:
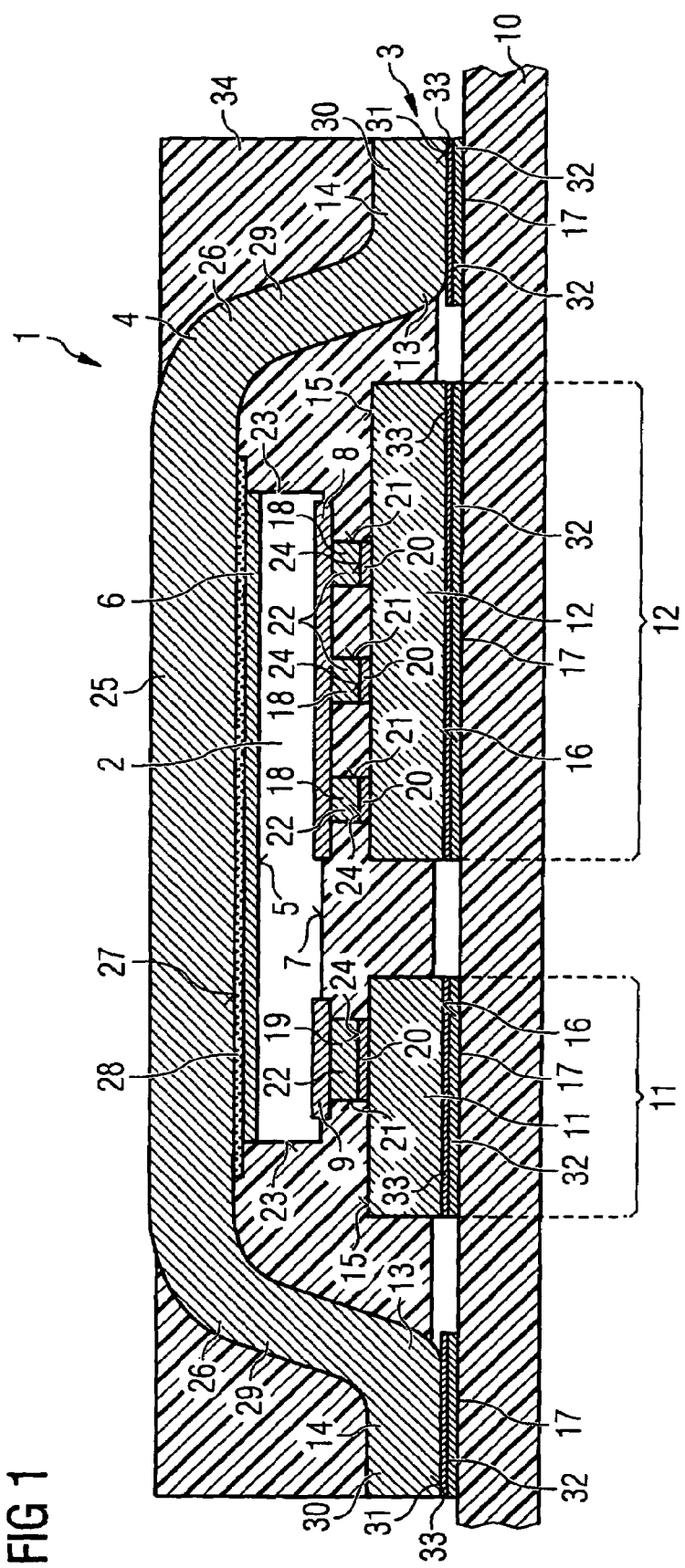
FIG. 1 illustrates an electronic component comprising a vertical MOSFET device according to a first embodiment.

In an embodiment, an interconnection structure is provided which comprises an electrically conductive bump. The electrically conductive bump comprises a metal body having a distal end and an outermost layer of diffusion solder is positioned on at least regions of the metal body. The metal body is free of solder. The use of a soft solder ball or soft solder joint is avoided and a mechanical and electrical connection may be formed between the metal body of the electrically conductive bump and a surface to which a connection is desired by a diffusion solder bond.

The phrase "diffusion solder bond" is used in this context to denote a connection structure which is mechanically and electrically attached to a contiguous surface by a layer comprising intermetallic phases. The intermetallic phases are formed as a result of a diffusion soldering process and comprise chemical elements of a diffusion solder and of at least one contiguous material of the surface to which it is attached.

A diffusion solder bond has the advantage that the melting point of the intermetallic phases is higher than the melting point of the diffusion solder itself. Consequently, the bond which is formed as a result of the diffusion solder process has a melt temperature which is higher than the temperature at which the bond is formed. The diffusion solder bond, therefore, does not melt if the bond is subjected to a further heat treatment carried out at the diffusion soldering temperature or at a temperature below the melting point of the intermetallic phases such as a typical soft soldering temperature.

Consequently, the problem of the remelting of soft solder connections already produced, for example between the semiconductor device and a lead frame, during a subsequent solder reflow which is performed to mount the electronic component to the higher level circuit board is avoided. This remelting can lead to undesired movement of the previously connected components and, consequently, to unreliability or even failure of the previously correctly functioning connection and electronic component. This problem is avoided by the use of electrically conductive bumps comprising a metal body and outermost diffusion solder layer.

A diffusion solder bond also enables a second semiconductor component may be mounted on the die pad in a second diffusion bonding step without the diffusion solder bond connecting the first semiconductor component to the die pad melting. Consequently, the movement of the semiconductor components during subsequent diffusion solder steps or heat treatment steps, may be avoided. Electrically conductive bumps with diffusion solder bonds may be for multi-chip modules in which two or more chips or semiconductor components are mounted adjacent to one another directly on the die pad or for multi-chip modules in which two components are stacked one on top of the other.

Diffusion solder bonds are typically thinner than soft solder bonds. Diffusion solder bonds are typically less than 10 µm in thickness whereas soft solder bonds typically have a thickness of around 100 µm. The height of the interconnection structure is, therefore, reduced over that of a typical soft solder joint.

The lateral area occupied by the bond substantially corresponds to the lateral area of the semiconductor component. Consequently, a larger semiconductor power switch can be accommodated on a die attach region of a given size if a diffusion solder bond is used rather than a soft solder. Since the switching properties of the power switch are dependent on the area of the device, the performance of the component may be improved due to the provision of a larger switch on a die attach region of the same size. The structure for producing the diffusion solder bond, may be fabricated by depositing the structure on the semiconductor component so that additional process steps to dispense a soft solder can be avoided.

The metal body of the plurality of electrically conductive bumps consists essentially of one of the group of copper, nickel, aluminium, iron and an alloy thereof. The metal body may comprise a melting temperature which is greater than a melting temperature of the diffusion solder to provide a mechanically stable structure.

The diffusion solder layer may comprise Sn and one of the group consisting of Ag, Au, Cu and In or may comprise Au and Si or Ag and In. The diffusion solder layer may have a thickness t, where $0.1 \, \mu m \leq t \leq 10 \, \mu m$.

In an embodiment, at least one further adhesion layer is disposed between the metal body and the diffusion solder layer. The further layer comprises one of a metal and an alloy thereof, the metal being one of the group of elements Ni, Au, Ag, Pt and Pd.

In an embodiment, the distal end of the bump is generally planar. This provides a larger interfacial area between the metal body and the substrate to which it is mounted so that the contact resistance is reduced. In an embodiment, the diffusion solder layer is positioned on the distal end of the body and the side faces of the plurality of bumps may be free from diffusion solder. The bump may be columnar, such as a pillar, or the bump may taper from its base to its distal end.

The interconnection structure according to one of the embodiments may be provided on a semiconductor die and provide a contact to integrated circuit structures within the semiconductor die. The semiconductor die comprises a surface and a plurality of the electrically conductive bumps. Each electrically conductive bump comprises a metal body having a distal end. The metal body is free of solder and an outermost layer of diffusion solder is positioned on at least regions of the metal body. The plurality of electrically conductive bumps may provide a plurality of different electrical connections and provide a plurality of different electrical functions.

Alternatively, the plurality of electrically conductive bumps may be provide a single type of electrical connection between a large area contact pad of the semiconductor die and a large area contact pad of a substrate. The plurality of bumps may provide at least one of an anode contact and a cathode contact of the electronic component. For example, the plurality of electrically conductive bumps can provide the interconnection for a large area source electrode or drain electrode of a transistor device.

In an embodiment, the semiconductor die is a MOSFET (Metal Oxide Semiconductor Field Effect Transistor) device or a BJT (Bipolar Junction Transistor) device or IGBT (Insulated Gate Bipolar Transistor) device. The transistor device may be a power vertical transistor device. For a MOSFET device, the anode is normally called a source electrode, the cathode electrode a drain electrode and the control electrode a gate electrode. For a BJT device, the anode is an emitter electrode, the cathode is a collector electrode and the control electrode is a base electrode. For a IGBT device, the anode is an emitter electrode, the cathode is a collector electrode and the control electrode is a gate electrode. In an embodiment, the semiconductor die is in a semiconductor wafer.

In an embodiment, the distal end of the metal body of each of the plurality of bumps is generally planar and lies in a plane generally parallel with the surface of the semiconductor die. The diffusion solder layer is positioned on the distal end of the metal body and side faces of the metal body are free from the diffusion solder layer. This provides an interconnection structure with a layer of diffusion solder of a uniform thickness. Consequently, the formation of the intermetallic phases during the diffusion solder process and the mechanical and electrical joint produced is more uniform across the plurality of electrically conductive bumps so that the reliability of the connection structure as a whole is improved.

In an embodiment, a plurality of electrically conductive bumps, according to an embodiment previous described, electrically connect a vertical semiconductor power device to a substrate. In an embodiment, a configuration comprises a vertical semiconductor power device having a first device surface and a plurality of electrically conductive bumps positioned on the first device surface. Each electrically conductive bump comprises a metal body having a distal end. The metal body is free of solder. A substrate comprises a first substrate surface and a plurality of electrically conductive surfaces positioned on the first substrate surface. The plurality of electrically conductive bumps are attached to the electrically conductive surfaces of the substrate by a diffusion solder bond positioned between the metal body of the electrically conductive bumps and the electrically conductive surfaces of the substrate. The vertical semiconductor power device is electrically connected and physically mounted on the substrate by the plurality of electrically conductive bumps. The first device surface is an electrode of the power device and may be an anode electrode or a cathode electrode.

In an embodiment, the first device surface comprises an anode and a control electrode of a vertical semiconductor transistor device. One of the plurality of electrically conductive bumps is positioned on the control electrode and the remaining electrically conductive bumps are positioned on the anode.

In an embodiment, the first device surface comprises an anode and a control electrode of a vertical semiconductor transistor device. A further second electrically conductive bump which has essentially the same structure as the plurality of first electrically conductive bumps may be provided. The second electrically conductive bump provides a control contact or control electrode and is positioned on the control surface or electrode located on the first device surface of the vertical semiconductor power device.

In an embodiment, the substrate is one of a leadframe and a rewiring substrate of an electronic component. The interconnection structure provided by the plurality of electrically conductive bumps, therefore, provide an internal interconnection structure within the electronic component.

In an embodiment, the substrate is a printed circuit board. The interconnection structure provided by the plurality of electrically conductive bumps, therefore, provides an interconnection structure between an electronic component and an external substrate. This embodiment, the plurality of electrically conductive bumps provide the outer contact surfaces of the electronic component and are positioned directly between the first surface of the semiconductor die and contact pads positioned on the printed circuit board.

In an embodiment, an electronic component comprises at least one semiconductor die having a die surface. A plurality of soft solder-free electrically conductive bumps are positioned on the die surface, each of the plurality of bumps comprising a distal end covered by an outermost layer of diffusion solder. The outermost layer of diffusion solder covering the distal end of the plurality of bumps provides the outer contact surfaces of the electronic component.

In an embodiment, a method to manufacture an interconnection structure comprises providing a surface comprising a plurality of bumps each comprising a metal body having a distal end, the metal body being free of solder, and depositing a layer of diffusion solder on at least regions of the metal body to provide a plurality of electrically conductive bumps. The diffusion solder may be deposited by sputtering or evaporation or electro-deposition.

In an embodiment, the plurality of bumps is provided by producing a structured mask layer on the surface to be provided with a plurality of electrically conductive bumps. The mask layer comprises a plurality of through-openings. A metal or an alloy is deposited into the plurality of through-openings to provide a plurality of metal bodies and a layer of diffusion solder is deposited onto at least a distal end of the metal bodies. The mask layer is then removed to provide a plurality of electrically conductive bumps. The mask layer may be provided by photoresist.

The metal or alloy may deposited by electrodeposition or sputtering or evaporation to form the plurality of metal bodies of the bumps.

A method to produce a connection between the interconnection structure and a substrate comprises providing a substrate having a first substrate surface, wherein the substrate comprises a plurality of electrically conductive surfaces positioned on the first substrate surface. A semiconductor die having a die surface is provided, wherein a plurality of electrically conductive bumps is positioned on the die surface. Each electrically conductive bump comprises a solder free metal body having a distal end and an outermost layer of diffusion solder positioned on at least the distal end of the metal bodies.

The semiconductor die and the substrate are arranged with respect to each other so that the layer of diffusion solder positioned on the metal bodies is in surface to surface contact with the electrically conductive surfaces of the substrate. A diffusion solder process is carried out to attach, and electrically connect, the plurality of electrically conductive bumps to the electrically conductive surfaces of the substrate.

In an embodiment, the diffusion solder comprises a melting point and at least the surface of the substrate is heated to a temperature above the melting point of the diffusion solder. Afterwards, the diffusion solder layer of the plurality of bumps is brought into surface to surface contact with the surface of the substrate while the surface of the substrate is at a temperature above the melting point of the diffusion solder. This enables intermetallic phases to form at the interface between the diffusion solder layer and the surface of the substrate forming an electrical and mechanical connection between the semiconductor die and the substrate.

In an embodiment, the semiconductor die is pressed onto the surface of the substrate for a duration, the duration having a length sufficient to form intermetallic phases at the interface between the metal body of each of the plurality of bumps and the substrate to provide a diffusion solder bond. The duration may be in the range from 1 second to 10 minutes.

The substrate may be one of a leadframe of an electronic component, a rewiring substrate of an electronic component and a printed circuit board.

FIG. 1 illustrates a view of an electronic component 1 comprising a vertical MOSFET device 2 with electrically conductive bumps 18, 19, a leadframe 3 and a contact clip 4 according to a first embodiment.

The vertical MOSFET device 2 comprises a first lower side 7 which comprises a source electrode 8 and a gate electrode 9 and a second upper side 5 which comprises a drain electrode 6, which extends over the majority of the second side 5 of the MOSFET device 2. The first side 7 is positioned opposing the second side 5 and side faces 23 extend generally perpendicularly to the first side 7 and second side 5. The source electrode 8 is laterally much larger than the gate electrode 9. The gate electrode 9 is positioned in an edge region of the first surface 7 of the MOSFET device 2 and is surrounded on three sides by the source electrode 8 which extends over the majority of the first surface 7. The lateral arrangement of the source electrode 8 and the gate electrode 9 is not illustrated in FIG. 1.

In this context, "upper" and "lower" are defined in relation to the orientation of the electronic component 1 when it is mounted on a circuit carrier such as a printed circuit board. "Upper" is used to denote the side of the MOSFET device 2 which faces upwards and away from the printed circuit board, indicated in FIG. 1 by 10, and "lower" is used to denote the side of the MOSFET device 2 which faces towards the printed circuit board 10.

In this embodiment of the invention, the drain electrode 6 comprises a layer of aluminium with around 1% Si which is disposed directly on the upper surface 5 of the semiconductor body of the MOSFET device 2. The source electrode 8 and the gate electrode 9 are disposed directly on the lower side 7 of the semiconductor body of the MOSFET device 2 and also comprise aluminium with 1% Si. The outermost surface of the drain electrode 6 includes a thin layer (not illustrated) of an easily solderable material, such as silver.

The leadframe 3 of the electronic component 1 comprises a gate portion 11, a source portion 12 and two drain portions 13. The portions 11, 12 and 13 of the leadframe 3 are physically separate and are not physically joined. In this embodiment of the invention, the two drain portions 13 are positioned in two opposing edge regions of the electronic component 1 and are provided by a foot region 14 of the contact clip 4. the gate portion 11 and the source portion 12 each have an upper surface 15 which faces towards the first lower surface 7 of the MOSFET device 2 and a lower surface 16 which provides an outer contact area 17 of the electronic component 1. The gate portion 11 and source portion 12 of the leadframe 3 are provided by a structured metal sheet and have a thickness which is essentially the same. The upper surface 15 of the source portion 12 and the upper surface 15 of the gate portion in 11 are, therefore, essentially coplanar. The lower surface 16 of the source portion 12 and the lower surface 16 of the gate portion 11 are also essentially coplanar.

The MOSFET device 2 is mounted with its first side 7 comprising the source electrode 8 and gate electrode 9 facing the upper surface 15 of the source portion 12 and gate portion 11 the leadframe 3. The source portion 12 of the leadframe 3 is laterally larger than the source electrode 8 and protrudes laterally outside the lateral area of the MOSFET device 2. The gate portion of the leadframe 3 is also laterally larger than the gate electrode 9.

A plurality of first electrically conductive bumps 18 are disposed on the source electrode 8 and a single second electrically conductive bump 19 is arranged on the gate electrode 9. The source electrode 8 is attached, and electrically connected, to the source portion 12 of the leadframe 3 by the plurality of first electrically conductive bumps 18. The gate electrode 9 is attached and electrically connected to the gate portion 11 of the leadframe 3 by the second electrically conductive bump 19.

The electrically conductive bumps 18 and 19 are provided in the form of protrusions, each of which in this embodiment of the invention is laterally essentially square and has essentially the same height. Each electrically conductive bump 18, 19 has a metal body 22 and a distal end 24. The distal end 24 is generally planar and lies in a plane essentially parallel to the first surface 7 of the MOSFET device 2. The metal body consists essentially of copper and has a height of around 50 μm. A diffusion solder bond 20 is positioned on the distal end of each of the metal bodies 20 and is positioned directly between the metal body 20 and leadframe 3. The diffusion solder bond comprises Sn and Cu and has a thickness of approximately 5 μm. The side faces 23 of the metal body 20 remain uncovered by the diffusion solder layer.

The first surface 7 of the MOSFET 2 is spaced at a distance from the upper surface 15 of the leadframe 3 by the electrically conductive bumps 18, 19. This has the advantage that a smaller proportion of the heat generated by the device is dissipated into the leadframe. This reduces the amount of heat dissipated into the printed circuit board 10 and reduces the likelihood of over-heating neighbouring device mounted on the PCB. A larger amount of heat is, therefore, dissipated from the upper side of the MOSFET device. This heat can be more efficiently dissipated by the rear side away from the PCB and this can be further improved by mounting a further heat dissipating plate or fins on the upper surface of the contact clip 4.

The electrically conductive bumps 18 and 19 were deposited on the source electrode 8 and gate electrode 9 respectively by galvanic deposition. The electrically conductive bumps 18, 19 are conveniently manufactured on the wafer level for a number of MOSFET devices 2 simultaneously. After their fabrication, the wafer is singulated to provide individual MOSFET devices 2.

Firstly, a mask layer of photoresist was deposited on the first surface 7 and structured to provide a plurality of through-openings. Each through-opening extending to the source electrode 8 and gate electrode 9 on the first surface 7 of the MOSFET device 2 and having the dimensions and arrangement of the electrically conductive bumps 18, 19. The metal body 20 was then deposited into the through-openings and a layer of diffusion solder deposited on the distal end 24 of the metal bodies 20. The photo resist layer was then removed.

The as-deposited layer of diffusion solder comprises Sn and Cu. The MOSFET device 2 is mounted on the leadframe 3 by carrying out a diffusion solder process during which the as deposited diffusion solder melts and reacts with the material of the contiguous surfaces to form intermetallic phase and a diffusion solder bond 20. Since the intermetallic phases have a higher melting point than the temperature at which the diffusion older process is carried out, the diffusion solder bond 20 is created by a solidification of the diffusion solder layer.

The source electrode 8 is mounted on, and electrically connected to, the upper surface 15 of the source portion 12 by a diffusion solder bond 20. Similarly, the electrically conductive bump 19 positioned on the gate electrode 9 is electrically connected to the gate portion 11 of the leadframe 3 by a diffusion solder bond 20.

The electronic component 1 further comprises a contact clip 4 which comprises a flat web portion 25 and two peripheral rim portions 26. The flat web portion 25 is laterally larger than the MOSFET device 2 on two opposing sides of the MOSFET device 2. Therefore, a peripheral rim region 26 extends over two opposing side faces 23 of the MOSFET device 2. The bottom surface 27 of the flat web portion 25 is disposed on, and electrically connected to, the drain electrode 6, positioned on the upper side 5 of the MOSFET device 2, by a layer 28 of soft solder.

The contact clip 4 has substantially a U-shape in the view of FIG. 1. Each opposing peripheral rim portion 26 comprises a leg 29 which extends downwards from the flat web portion 25 in directions towards the bottom side 27 of the flat web portion 25. The legs 29 of the peripheral rim portion 26 are spaced at a distance from two opposing side faces 23 of the MOSFET device 2. The leg 29 of each of the peripheral rim portions 26 each include a foot 30 which extends in a direction away from the side face 23 of the MOSFET device 2. The contact clip 4 has essentially a uniform thickness and may be fabricated by stamping and bending a metal foil or sheet.

The lower surface 31 of each of the feet 30 of the peripheral rim portion 26 of the contact clip 4 lies in essentially the same plane as the outer surface 16 of the source portion 12 and of the gate portion 11 of the leadframe 3. The outer surfaces 16 of the gate portion 11, source portion 12 of the leadframe 3 and outer surfaces 31 of the two feet 30 of the peripheral rim portions 26 of the contact clip 4, therefore, provide surface mountable contact surfaces 17 of the electronic component 1.

The MOSFET device 2, electrically conductive bumps 18, 19 , upper surface 15 of the leadframe 3 and peripheral rim portions of the contact clip 4 are embedded in a plastic encapsulation compound 34. The central region of the flat web portion of the contact clip 4 remains uncovered by the encapsulation compound 34 and the outer contact areas 17 of the electronic component also remain free from the plastic encapsulation compound 34.

The contact clip 4 provides the electrical connection between the drain electrode 6 positioned on the upper side 5 of the MOSFET device 2 and the printed circuit board 10. As can be seen in FIG. 1, the surface mountable contact surfaces 17 are essentially coplanar and are mounted on, and electrically connected to, the printed circuit board 10 by soft solder 32. The lower outer surfaces 31 of the feet 30 as well as the lower outer surface 16 of the gate portion 11 and source portion 12 of the leadframe 3 also include an easily solderable layer 33.

The electronic component 1 is mounted on the PCB 10 by soft solder connections 32. Since the electrically conductive bumps 18, 19 and, therefore, the gate electrode 9 and source electrode 8 are connected to the leadframe 3 by diffusion solder bonds 20, these connections do not melt during the solder process to mount the electronic component on the PCB 10.

In a further embodiment not illustrated in the figures, the electronic component further includes a second semiconductor device. The semiconductor device may be a second vertical power MOSFET device.

The electronic component 1 is manufactured by providing a semiconductor wafer including a plurality of MOSFET devices 2 arranged in rows and columns.

The drain electrode 6 is deposited on a second surface 5 of the wafer in each of the plurality of device positions. The source electrode 8, gate electrode 9 of each of the plurality of MOSFET devices 2 are then deposited on first surface 7 of the wafer and the electrically conductive bumps 18, 19 deposited on the source electrode 8 and gate electrode 9 respectively as previously described.

A leadframe 3 is provided which has the form of a structured metal sheet comprising a plurality of device positions, each device position providing a leadframe 3 for a single electronic component. In an embodiment, the leadframe 3 comprises a source portion 12 and gate portion 11 in each of the device positions.

The leadframe 3 is then heated to a temperature above the melting point of the diffusion solder and the first surface 7 of the MOSFET device 2 is aligned facing the upper surface 15 of leadframe 3 such that the gate electrode 9 is positioned above the gate portion 11 and the source electrode 8 is positioned above the source portion 12. The diffusion solder layer 21 positioned on the outer surface of each of the spacing elements 18, 19 is brought into contact with the upper surface 15 of the respective portion of the leadframe 3. Intermetallic phases are formed between the material of the diffusion solder 21 and the leadframe 3 which have a higher melting point than the melting point of the diffusion solder. The MOSFET device 2 is, therefore, attached to the gate portion 11 and source portion 12 of the leadframe 3 by the solidification of the interface between the electrically conductive bumps 18, 19 and the leadframe 3. The gate portion 11 and source portion 12 of the leadframe 3 therefore provide the chip carrying portions of the leadframe 3.

A contact clip 4 is provided which comprises a flat web portion 25 and two peripheral rim portions 26 which extend on two opposing sides of the flat web portion 25. The flat web potion 25 is provided with an area so that the peripheral rim portions 26 extend over and beyond the side faces 23 of the semiconductor power switch 2 and are not in contact with the side faces 23. Each peripheral rim portion 26 comprises a leg 29 and foot 30. The contact clip 4 is provided with a shape such that the lower surface 31 of the foot 30 of the peripheral rim portion 26 is approximately coplanar with the lower surfaces 16 of the source portion 12 and gate portion 11 when the lower surface 27 of the flat web portion 25 is mounted on the drain electrode 6.

The lower surface 27 of the flat web portion 25 is mounted on the drain electrode 6 by a layer of soft solder 28. Due to the form of the content clip 4, the lower surfaces 31 of the two feet 30 are essentially coplanar with the lower surfaces 16 of the gate portion 11 and of portion 12 leadframe 3 so that these surfaces provide surface mountable outer contact surfaces 17 of the electronic component 1.

The electronic component 1 is then encapsulated using a transfer molding process. The outer contact surfaces 17 and upper surface of the flat web portion 25 of the contact clip 4 remain exposed from the plastic encapsulation compound 34.

Figure 2:
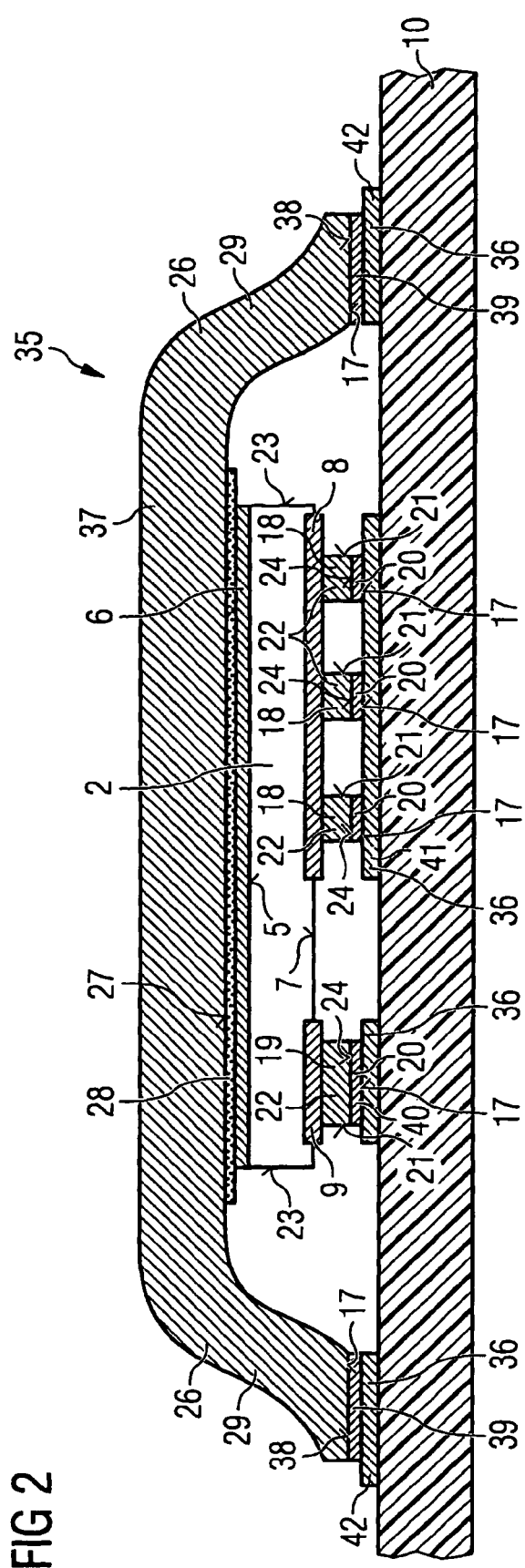
FIG. 2 illustrates an electronic component comprising a vertical MOSFET device according to a second embodiment.

FIG. 2 illustrates an electronic component 35 according to a second embodiment. The electronic component 35 also includes a vertical power MOSFET device 2 with electrically conductive bumps 18, 19 positioned on the first surface. The electronic component 35 differs from the electronic component 1 illustrated in FIG. 1 in that a leadframe is not provided. The outer surfaces of the diffusion solder layer positioned on the distal ends 24 of the metal bodies 20 of the electrically conductive bumps 18, 19 provide outer contact surfaces 17 of the electronic component 35.

The MOSFET device 2 of the electronic component 35 can be mounted directly on a printed circuit board 10 which includes contact areas 36 on its upper surface which have an arrangement which corresponds to the arrangement of the plurality of first electrically conductive bumps 18 which provide the outer contact areas 17 of the source electrode 8 and the second electrically conductive bump 19 which provides the outer contact surface 17 of the gate electrode 9.

The PCB 10 comprises a gate contact area 40, a source contact areas 41 and two drain contact areas 42 whose size and arrangement corresponds to the arrangement of the electrically conductive bumps 18, 19 and contact clip 37. The diffusion solder bond 20 positioned on the distal end 24 of the electrically conductive bumps 18, 19 is in direct contact with the contact surfaces 36 of the PCB 10.

The electronic component 35 also includes a contact clip 37 which electrically connects the drain contact 6 to the drain portions 36 of the printed circuit board 10. The contact clip 37 comprises a flat web portion 25 and two peripheral rim portions 26. The lower surface 27 of the flat web portion 25 is mounted on, and electrically connected to, the drain electrode 6 positioned on the upper side 5 of the MOSFET device 2.

A peripheral rim portion extends form two opposing sides of the flat web portion 25 and comprises a leg portion 29 and foot 30. The leg 29 extends towards the printed circuit board 10 from the flat web portion 25 in a direction towards the PCB 10 and extends into a foot 30 which extends in a direction away from the side face 23 of the MOSFET device 2. The lower surface 38 of each foot 30 provides a peripheral rim surface and is mounted on a drain contact area 42 of the printed circuit board 10 by soft solder 39.

The contact clip 4 is provided with a form such that the MOSFET device 2 is accommodated between the two inner surfaces of the two opposing peripheral rim portions 26. The leg 29 of the peripheral rim portion 26 extends a distance such that the lower surface 38 of the foot 30 is mounted on the upper surface 15 of the drain portion 36 of the printed circuit board 10 when the bottom surface 27 of the flat web portion 25 is mounted on the drain electrode 6.

The electronic component 35 is assembled by providing a PCB 10 which has contact areas 36 on its upper surface which provide a gate contact area 40, a source contact area 41 and two drain contact areas 42 with an arrangement corresponding to that of the MOSFET device 2 and contact clip 37.

A vertical power MOSFET device 2 is provided which comprises a first surface 7 on which the gate electrode 9 and source electrode 8 are positioned. A drain electrode 6 is positioned on the opposing second surface 5 of the MOSFET device 2. A plurality of electrically conductive bumps 18, 19 are deposited on the anode 8 and gate electrode 9 and a diffusion solder layer is deposited on the upper outer surface of each of the electrically conductive bumps 18, 19, as previously described.

A contact clip 37 is provided which comprises a flat web portion 25 and two peripheral rim portions 26 which extend to form two opposing edges of the flat web portion 25. Each performing portion 26 comprises a leg 29 and foot 30. The underside or lower surface of the foot 30 provides a peripheral rim surface 38.

The PCB 10 is heated to a temperature above the melting point of the diffusion solder. The MOSFET device 2 is aligned with the PCB 10 so that the first surface 7 is facing towards the upper surface of the PCB 10 and the gate electrode 9 is positioned above the gate contact area 40 and the source electrode 8 is positioned above the source contact area 41 of the PCB 10. The MOSFET device 2 is brought into contact with the PCB 10 so that the outer surfaces of the electrically conductive bumps 18, 19 are brought into surface-to-surface contact with the contact areas 36 providing a gate contact area 40 and source contact area 41 of the PCB 10, respectively. The MOSFET device 2 is mounted on, and electrically connected to, the gate contact area 40 and source contact area 41 of PCB 10 due to the formation of intermetallic phases between the diffusion solder and the PCB 10 to produce diffusion solder bond 20.

The contact clip 37 is positioned so that the flat web portion 25 is in contact with the drain electrode 6 and the peripheral rim portion 38 is in contact with the upper surface of the drain contact area 42 of PCB 10. This embodiment of the invention, the contact clip 37 is connected to the drain electrode 6 and drain portions 36 of the leadframe 3 by soft solder joints. The contact clip 37 can, therefore, be mounted on the MOSFET device 2 without causing the diffusion solder bonds 20 attaching the MOSFET 2 to the PCB 10 to melt.

REFERENCE NUMBERS 1 first electronic component
2 MOSFET device
3 leadframe
4 contact clip
5 second upper side
6 drain electrode
7 first lower side
8 source electrode
9 gate electrode
10 printed circuit board
11 gate portion of leadframe
12 source portion of leadframe
13 drain portion of leadframe
14 foot region of contact clip
15 upper surface of gate portion and source portion
16 lower surface of source portion and gate portion
17 outer contact area of electronic component
18 first electrically conductive bump
19 second electrically conductive bump
20 diffusion solder bond
21 side surfaces of electrically conductive bump
22 metal body of electrically conductive bump
23 side face of MOSFET
24 distal end of electrically conductive bump
25 flat web proportion
26 peripheral rim portion
27 bottom surface of flat web portion
28 soft solder layer
29 leg
30 foot
31 lower surface of foot
32 soft solder layer
33 solder wettable layer
34 plastic encapsulation compound
35 second electronic component
36 contact areas of PCB
37 second contact clip
38 lower surface of the foot
39 soft solder layer
40 gate contact area of PCB
41 source contact area of PCB
42 drain contact area of PCB

What is claimed is:

1. An interconnection structure comprising an electrically conductive bump, wherein the electrically conductive bump comprises a metal body having a distal end, wherein the metal body is free of solder and wherein an outermost layer of diffusion solder comprising a plurality of intermetallic phases is positioned on at least regions of the metal body.

2. An interconnection structure according to claim 1, wherein the distal end of the bump is generally planar.

3. An interconnection structure according to claim 2, wherein the diffusion solder layer is positioned on the distal end of the body.

4. An interconnection structure according to claim 3, wherein side faces of the plurality of bumps are free from diffusion solder.

5. An interconnection structure according to claim 2, wherein the bump is columnar.

6. An interconnection structure according to claim 1, wherein the metal body comprises a melting temperature which is greater than a melting temperature of the diffusion solder.

7. An interconnection structure according to claim 1, wherein the metal body consists essentially of one of the group of copper, nickel, aluminium, iron and an alloy thereof.

8. An interconnection structure according to claim 1, wherein the diffusion solder comprises Au and Si or Au and Sn or Ag and Sn or Cu and Sn or Ag and In.

9. An interconnection structure according to claim 1, further comprising at least one adhesion layer positioned between the metal body and outermost diffusion solder layer of the bump.

10. An interconnection structure according to claim 9, the adhesion layer consists essentially of one of Ag, Au, Pd, and Pt.

11. An interconnection structure according to claim 1, wherein the diffusion solder layer has a thickness t, wherein $0.1\ \mu m \leq t \leq 10\ \mu m$.

12. A semiconductor die, wherein the semiconductor die comprises a surface and a plurality of electrically conductive bumps, wherein each electrically conductive bump comprises a metal body having a distal end, and wherein an outermost layer of diffusion solder comprising a plurality of intermetallic phases is positioned on at least regions of the metal body.

13. A semiconductor die according to claim 12, wherein the semiconductor die is a MOSFET, an IGBT or a BJT device.

14. A semiconductor die according to claim 13, wherein the semiconductor die is a vertical power transistor device.

15. A semiconductor die according to claim 12, wherein the plurality of bumps consist essentially of one of the group of copper, nickel, aluminium, iron and an alloy thereof.

16. A semiconductor die according to claim 7, wherein the distal end of the metal body of each of the plurality of bumps is generally planar and lies in a plane generally parallel with the surface of the semiconductor die and wherein the diffusion solder layer is positioned on the distal end of the metal body and side faces of the metal body are free from the diffusion solder layer.

17. A semiconductor die according to claim 12, wherein the diffusion solder comprises Au and Si or Au and Sn or Ag and Sn or Cu and Sn or Ag and In.

18. A semiconductor die according to claim 12, wherein the semiconductor die is in a semiconductor wafer.

19. An apparatus, comprising: at least one semiconductor die having a first device surface, wherein a plurality of electrically conductive bumps is positioned on the first device surface, each electrically conductive bump comprising a metal body having a distal end, and a substrate comprising a first substrate surface, wherein the substrate comprises electrically conductive surfaces positioned on the first substrate surface, wherein the plurality of electrically conductive bumps are attached to the electrically conductive surfaces of the substrate by a diffusion solder bond, comprising a plurality of intermetallic phases, positioned between the metal body of the electrically conductive bumps and the electrically conductive surfaces of the substrate.

20. The apparatus according to claim 19, wherein the semiconductor die is a vertical MOSFET, IGBT or BJT power device.

21. The apparatus according to claim 19, wherein the plurality of bumps consist essentially of one of the group of copper, nickel, aluminium, iron and an alloy thereof.

22. The apparatus according to claim 19, wherein the diffusion solder bond comprises Au and Si or Au and Sn or Ag and Sn or Cu and Sn or Ag and In.

23. The apparatus according to claim 19, wherein the substrate is one of a leadframe and a rewiring substrate of an electronic component.

24. The apparatus according to claim 20, wherein the first device surface comprises an anode and a control electrode and one of the plurality of electrically conductive bumps is positioned on the control electrode and the remaining electrically conductive bumps are positioned on the anode.

25. The apparatus according to claim 19, wherein the substrate is a printed circuit board.

26. An electronic component comprising at least one semiconductor die having a surface, wherein a plurality of soft solder-free electrically conductive bumps are positioned on the surface, wherein each of the plurality of bumps comprises a distal end, the distal end being covered by an outermost layer of diffusion solder, wherein the outermost layer of diffusion solder, comprising a plurality of intermetallic phases and covering the distal end of the plurality of bumps, provides the outer contact surfaces of the electronic component.

27. An electronic component according to claim 26, wherein at least one semiconductor die is a vertical power transistor device and the plurality of bumps provide an anode contact of the electronic component.

28. The interconnection structure of claim 1, wherein the diffusion solder consists essentially of the plurality of intermetallic phases.

29. The interconnection structure of claim 12, wherein the diffusion solder consists essentially of the plurality of intermetallic phases.

30. The apparatus of claim 19, wherein the diffusion solder bond consists essentially of the plurality of intermetallic phases.

31. The electronic component of claim 26, wherein the diffusion solder bond consists essentially of the plurality of intermetallic phases.

* * * * *